United States Patent
Rius

(10) Patent No.: US 8,020,513 B2
(45) Date of Patent: Sep. 20, 2011

(54) COOLED DEVICE FOR PLASMA DEPOSITING A BARRIER LAYER ONTO A CONTAINER

(75) Inventor: Jean-Michel Rius, Octeville sur Mer (FR)

(73) Assignee: Sidel Participations, Octeville sur Mer (FR)

( * ) Notice: Subject to any disclaimer, the term of this patent is extended or adjusted under 35 U.S.C. 154(b) by 689 days.

(21) Appl. No.: 12/091,390

(22) PCT Filed: Oct. 23, 2006

(86) PCT No.: PCT/FR2006/002374
§ 371 (c)(1),
(2), (4) Date: Apr. 24, 2008

(87) PCT Pub. No.: WO2007/048912
PCT Pub. Date: May 3, 2007

(65) Prior Publication Data
US 2008/0282980 A1 Nov. 20, 2008

(30) Foreign Application Priority Data

Oct. 24, 2005 (FR) ..................................... 05 10827

(51) Int. Cl.
*C23C 16/00* (2006.01)
*C23F 1/00* (2006.01)
*H01L 21/306* (2006.01)
*B05D 7/22* (2006.01)

(52) U.S. Cl. ............ 118/723 MW; 118/723 I; 118/724; 156/345.37; 156/345.41; 427/230; 427/237; 427/238

(58) Field of Classification Search .......... 118/723 MW, 118/724, 723 I; 156/345.41, 345.37; 427/230, 427/237, 238
See application file for complete search history.

(56) References Cited

U.S. PATENT DOCUMENTS

| 4,866,346 A | 9/1989 | Gaudreau et al. | |
|---|---|---|---|
| 5,160,545 A * | 11/1992 | Maloney et al. | ............ 118/725 |
| 5,311,103 A * | 5/1994 | Asmussen et al. | ....... 315/111.81 |
| 6,211,621 B1 * | 4/2001 | Caughran et al. | ........ 315/111.21 |
| 6,328,805 B1 | 12/2001 | Rius | |
| 6,565,791 B1 | 5/2003 | Laurent | |
| 2002/0101191 A1 * | 8/2002 | Dolan et al. | .................. 315/248 |

FOREIGN PATENT DOCUMENTS

| FR | 2 783 667 A1 | 3/2000 |
|---|---|---|
| WO | 99/49991 A1 | 10/1999 |
| WO | 2004/052060 A1 | 6/2004 |

* cited by examiner

Primary Examiner — Parviz Hassanzadeh
Assistant Examiner — Rakesh K Dhingra
(74) Attorney, Agent, or Firm — Sughrue Mion, PLLC

(57) ABSTRACT

A device for plasma depositing a thin film of a barrier material on an internal wall of a container includes: an electromagnetic wave generator; a cavity connected to the generator and made of a conductive material; a chamber positioned in the cavity and made of a material that is transparent to electromagnetic waves coming from the generator; and openings made in the cavity and oriented parallel to one another.

9 Claims, 5 Drawing Sheets

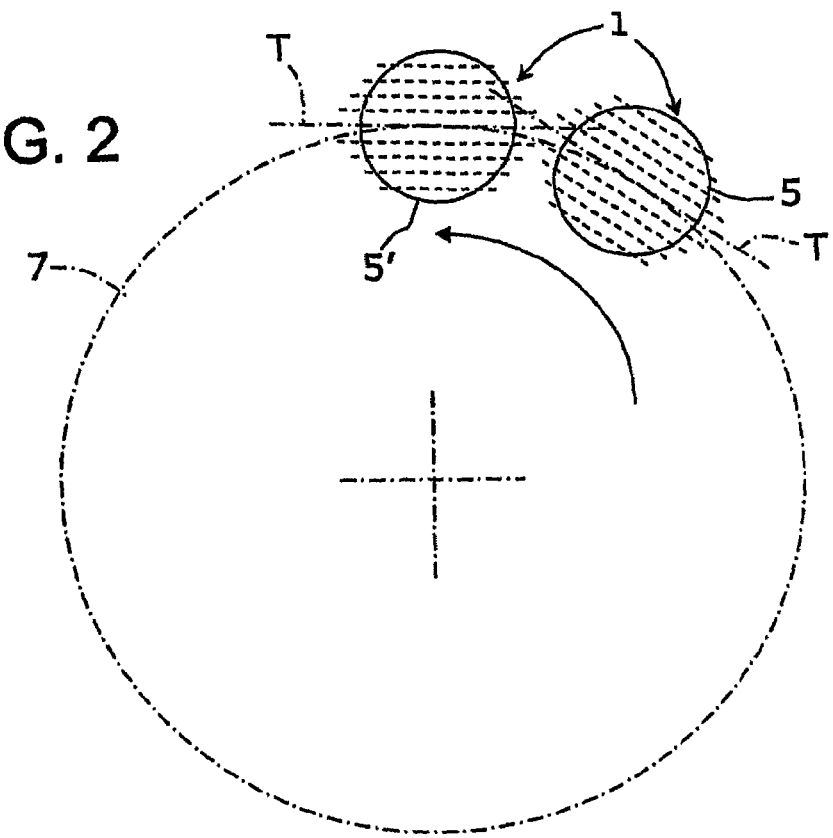
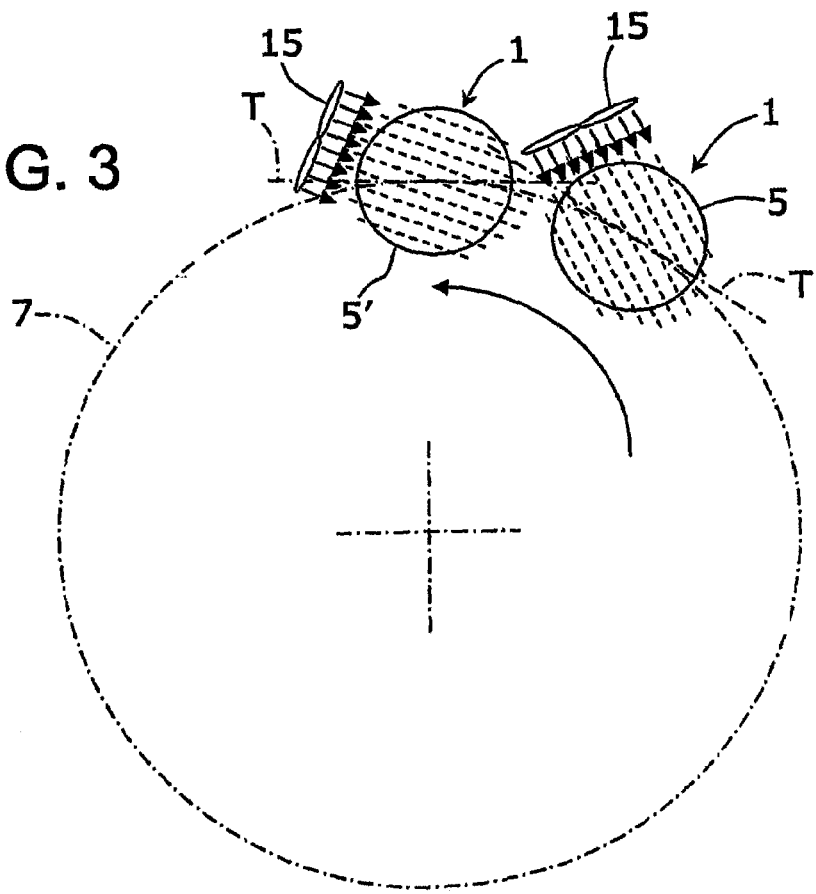

COOLED DEVICE FOR PLASMA DEPOSITING A BARRIER LAYER ONTO A CONTAINER

BACKGROUND

The invention relates to the manufacture of containers, in the course of which their internal wall is coated with a layer comprising a barrier material.

It is known to deposit a barrier material by plasma. This technology is well explained in European Patent EP 1068032 in the name of the applicant, or else in U.S. Pat. No. 5,522,351.

A device used for such deposition is also described in the abovementioned document EP 1068032. This device comprises an electromagnetic wave generator, a cavity connected to the generator and made of a conductive material (generally metal), along with a chamber positioned in the cavity and made of a material (generally quartz) that is transparent to the electromagnetic waves coming from the generator.

After the container has been introduced into the chamber, a moderate vacuum (around 30 mbar to 100 mbar) is created in the chamber, while a high vacuum (a few μbar) is created in the container. A precursor gas (such as acetylene) is introduced into the container, this precursor being activated by electromagnetic bombardment (generally with low-power UHF microwaves at 2.45 GHz) to transform it into the cold plasma state and so to generate species, including hydrocarbons (comprising $CH$, $CH_2$, $CH_3$) which is deposited as a thin film (around 60 nm to 200 nm) on the internal wall of the container.

The container to be treated is generally made of a thermoplastic polymer such as PET (polyethylene terephthalate) which is, at 20° C., transparent to electromagnetic microwaves. The same applies to quartz, the dielectric properties of which, being favorable (at a temperature of around 20° C.) to microwave transmission, make it particularly attractive for the production of the chamber surrounding the container.

In laboratory conditions, the treatment of a container, including the application of the material then its preparation (in particular regarding temperature and pressure), may take several minutes or even several hours.

For industrial production, a series of devices of the abovementioned type (for example, around twenty) are mounted on a carousel and operate continuously for the scheduled treatment of several thousands of containers. The unit cycle time (that is, per device) is several seconds.

At this rate, problems arise with which laboratory workers are not generally confronted. Thus the inventors have noticed, in the course of the industrial process, the appearance of irregularities in the thickness of the barrier layer and of deformations of the PET containers.

SUMMARY

The invention aims in particular to solve this problem by proposing a solution guaranteeing a better distribution of the barrier layer and a reduction in deformations of the container during a plasma treatment.

To this end, the invention proposes a device for plasma depositing a thin film of a barrier material on an internal wall of a container, this device comprising:
an electromagnetic wave generator;
a cavity connected to the generator and made of a conductive material;
a chamber positioned in the cavity and made of a material that is transparent to the electromagnetic waves coming from the generator; and
means for cooling the chamber.

Following in-depth studies, the inventors formulated the hypothesis that the irregularities in the barrier layer might be due to two phenomena, both consequences of one and the same cause.

The first phenomenon: untimely heating of the containers during the process. The transmission of microwaves through the PET is in fact a decreasing function of the temperature of the material. Although PET can be considered totally transparent to microwaves at around 20° C., this transparency is no longer sufficient at around 50° C., which results in a certain inhomogeneity of the plasma. The heating of the container may have another consequence in the case of what are called thin-walled containers (less than or equal to about 200 μm), which are tending to increase in number today with the increase in the price of the raw material (PET), coming from the petrochemical industry: the stretch-blowing of thin-walled containers in fact generates residual stresses in the container formed. In the absence of subsequent treatment these stresses are not problematic. Conversely, if the container is heated in the course of the plasma treatment, the residual stresses relieved by the heating cause local deformations of the container (all the more significant if close to the glass transition temperature). It is then necessary to dispose of the container.

The inventors assumed that this heating may in reality come from heating of the quartz chamber, the heat transfer from the chamber to the container taking place by thermal convection. This assumption is bold, as the pressure prevailing between the chamber walls and the container is very low (around 30 to 100 mbar, as we have seen) in comparison with atmospheric pressure.

The second phenomenon is a reduction in the transparency of the chamber to electromagnetic microwaves, which results in an inhomogeneous bombardment of the precursor. The inventors assumed that the relative opacity of the chamber was due to the increase in its temperature, the presence of impurities in the chosen material (in this case quartz) being sufficient to cause the chamber to heat up due to the action of the electromagnetic microwaves. This assumption too seems bold, since, to the knowledge of the inventors, a slight increase in the temperature of a material assumed to be perfectly transparent to microwaves (in this case, the temperature of the chamber was measured at 60° C. in an industrial production situation, while this temperature is 20° C. in laboratory conditions) has never before been considered problematic.

The relevance of the hypotheses formulated by the inventors was demonstrated by the implementation of the proposed solution: by cooling the chamber (to maintain it at a temperature of less than around 30° C.), a more homogeneous distribution of the barrier layer is effectively obtained, along with elimination of deformations of the bottle.

According to one embodiment, the cooling means comprise a multitude of openings made in the cavity, preferably oriented parallel to each other, for example in a direction forming an angle with a path of the device. These openings allow a current of air which cools the chamber to be established when the device is moved.

The angle formed by the axis of the openings with the path of the device is, for example, between 5° and 45°.

A fan may in addition be positioned upstream of the cavity, facing it, to aid the circulation of air in the cavity around the chamber.

The openings are preferably distributed substantially over the entire circumference and/or substantially the entire height of the cavity. Furthermore, the density of openings over the cavity is, for example, between $1/cm^2$ and $10/cm^2$.

The cooling means may comprise, in addition to or as an alternative to openings, a specific device for generating a circulation of air in the chamber. This device comprises, for example, a fan positioned under or on the chamber, or air supply line along with a vacuum pump, both connected to the chamber.

BRIEF DESCRIPTION OF DRAWINGS

Other objects and advantages of the invention will become apparent in the light of the following description, with reference to the appended drawings in which:

FIG. 2 is a schematic view showing two adjacent devices mounted on the same carousel;

FIG. 3 is a similar view to FIG. 2 according to a variant;

DETAILED DESCRIPTION

Figure 1:
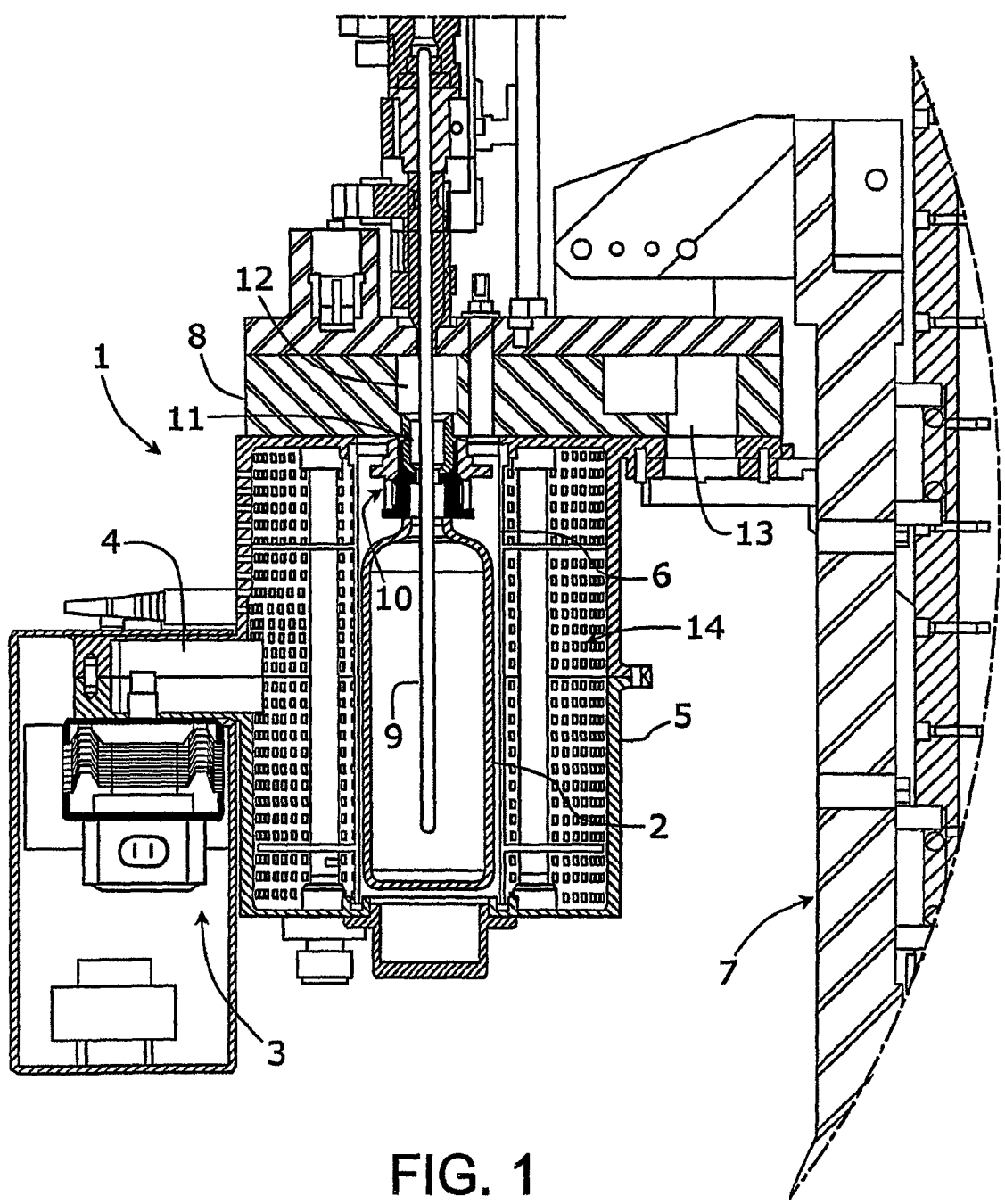
FIG. 1 is a cross-sectional view in elevation showing a device for plasma depositing a barrier layer on the internal wall of a container.

FIG. 1 shows a device 1 for plasma depositing of a barrier layer on the internal wall of a container 2 previously formed by blow molding or stretch-blow molding of a preform made of a thermoplastic such as PET.

This device 1, hereinafter called reactor to comply with the industrial terminology in use, comprises a generator 3 of low-power electromagnetic microwaves at a frequency of 2.45 GHz, connected by a waveguide 4 to a cavity 5 made of a conductive material, for example steel or (preferably) aluminum or an aluminum alloy. Positioned in the cavity 5 is a chamber 6 made of a material suitable for transmission of electromagnetic microwaves, such as quartz. It should be noted that the thickness of the wall of the cavity 5 is around 5 mm, while that of the wall of the chamber 6 is between 2 and 3 mm.

The reactor 1 is mounted, with a series of like reactors, on a carousel 7 rotated, for simultaneous treatment of several containers 2, between one or more loading stations and one or more unloading stations. This carousel 7 is marked in FIGS. 2 and 3 by its circular path passing through the axes X of the cavities 5.

The cavity 5 and the chamber 6 are jointly covered by a removable cover 8 allowing the container 2 to be sealed in the chamber 6. The cover 8 is penetrated by an injector 9 for introducing a precursor gas, such as acetylene, into the container 2. A support 10, from which the container 2 is hung, is mounted on the cover 8. This support 10 has a hole 11 which opens into a post-discharge chamber 12 through which the residual species pass at the end of reaction. The post-discharge chamber 12 is connected to a circuit 13 for evacuating the residual species, linked to a pump (not depicted) which serves both to establish a high vacuum (of several μbar) in the container 2 before introduction of the precursor gas and to pump out the residual species at the end of reaction.

The chamber 6 is also linked to the circuit 13 via a valve allowing the chamber 6 to be isolated from the interior of the container 2, after this has been introduced, a moderate vacuum (between 30 and 100 mbar) being created in the chamber 6. The pressure in the chamber 6 depends on the thickness of the container 2: a vacuum of about 100 mbar, which is suitable for containers of normal thickness (in the region of 0.35 mm), is not suited to containers of low thickness (in the region of 0.2 mm), the pressure differential between the interior and exterior perhaps sufficing to cause them to collapse. For these low-thickness containers, a vacuum in the region of 30 mbar is established in the chamber.

To avoid heating of the chamber 6 and all the drawbacks, mentioned by way of introduction, which ensue from this, each reactor 1 is equipped with means for cooling its chamber 6.

These cooling means may take diverse forms.

Figure 4:
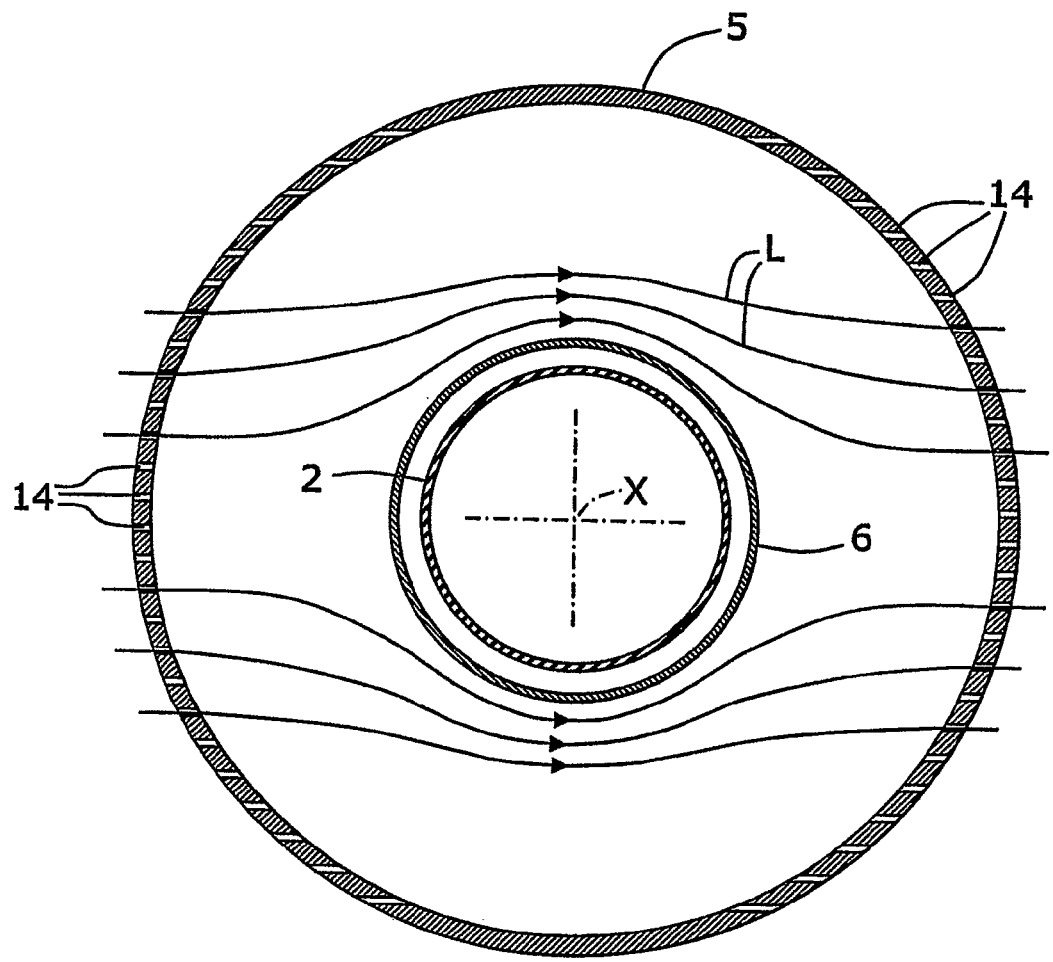
FIG. 4 is a partial cross-sectional view showing a device through which a flow of air passes.

According to a first embodiment, the chamber 6 is cooled from the exterior, the cavity 5 having a multitude of openings 14, preferably distributed over the entire circumference of the cavity 5 (or over only a part of this), and over its entire height (or over only a part of this). Rotation of the carousel 7 causes, as shown in FIG. 4, the appearance of an air current (marked in FIG. 4 by the field lines L) in the cavity 5, which current, passing through the cavity from one side to the other, cools the chamber 6, keeping it at a temperature low enough (less than or equal to 30° C.) for the transmission of microwaves not to be affected and for the heat transfer between the chamber 6 and the container 2 to be low enough not to lead to significant heating of the latter.

The openings 14 may be circular or rectangular in section. Their diameter (or their side) is preferably between 1 mm and 10 mm, while their density may be between $1/cm^2$ and $10/cm^2$, depending on the speed of rotation of the carousel 7 and the desired cooling effect.

Figure 6:
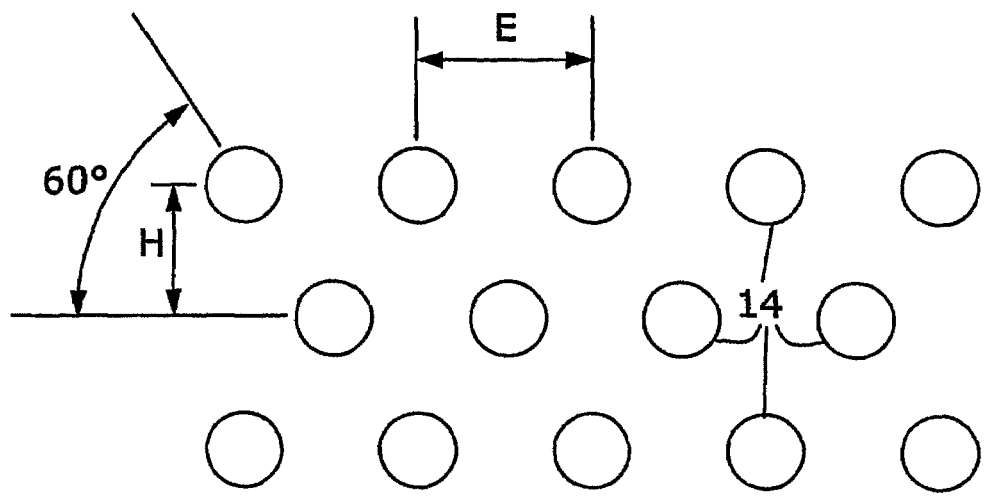
FIGS. 6 and 7 are detail views showing the distribution of openings over the cavity according to two envisioned configurations.
Figure 7:
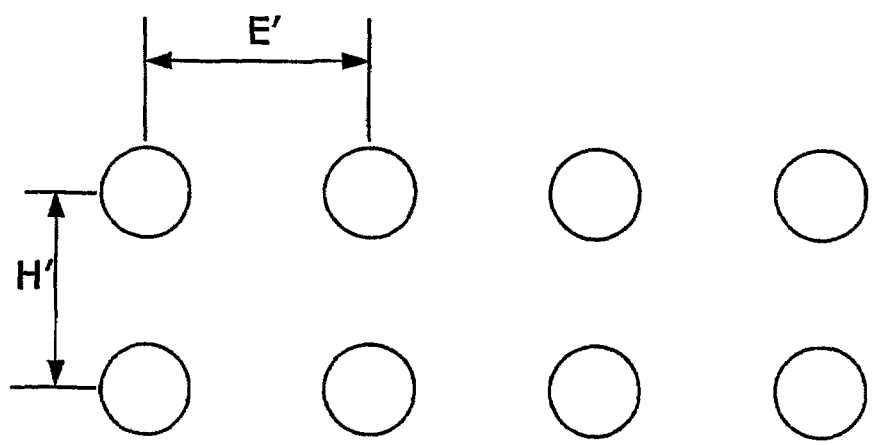

Two examples of patterns of distribution of the openings 14 are provided in FIGS. 6 and 7.

According to a first example (FIG. 6), the openings 14, with a diameter of 3 mm, are arranged quincuncially in superposed rows, the separation E between two openings 14 in the same row being around 5 mm, and the distance H separating two adjacent rows around 4.3 mm (in other words, the angle between the straight line joining the centers of the openings 14 in the same row and the straight line joining the centers of two neighboring openings in adjacent rows is around 60o).

According to a second example (FIG. 7), the openings 14, with a diameter of around 4 mm, are in a checkered arrangement, the distance E' between two neighboring openings 14 in the same row being around 9 mm, while the distance separating two adjacent rows is around 8 mm.

The orientation of the openings 14 may be radial. Nonetheless, to optimize the air flow it is preferable to orient them parallel to each other. Thus, they may be oriented parallel to the local tangent T to the path of the carousel 7 (as represented in FIG. 2, where the dotted lines have been drawn marking the axes of the openings 14), or form an angle with this, being turned toward the exterior of the carousel 7 and taking account of the direction of rotation (as represented in FIG. 3) so as essentially to draw fresh air into the cavity 5 while avoiding drawing in hot air coming from the adjacent cavity 5'.

In the absence of forced circulation of air, the angle of inclination between the axes of the openings 14 is preferably between 5° and 45°.

However, it is possible to equip each reactor 1 with a fan 15, positioned on the axis of the openings 14 facing the cavity 5, in front of this (that is, upstream of this, taking account of the direction of rotation of the carousel). In this case, the angle of inclination of the axes of the openings 14 is of less importance (it is, for example, possible to orient the axes of the openings 14 perpendicular to the local tangent T to the path), though it is, however, preferable that this angle be greater than 5° to avoid drawing in the flow of hot air coming from the preceding cavity 5.

Figure 5:
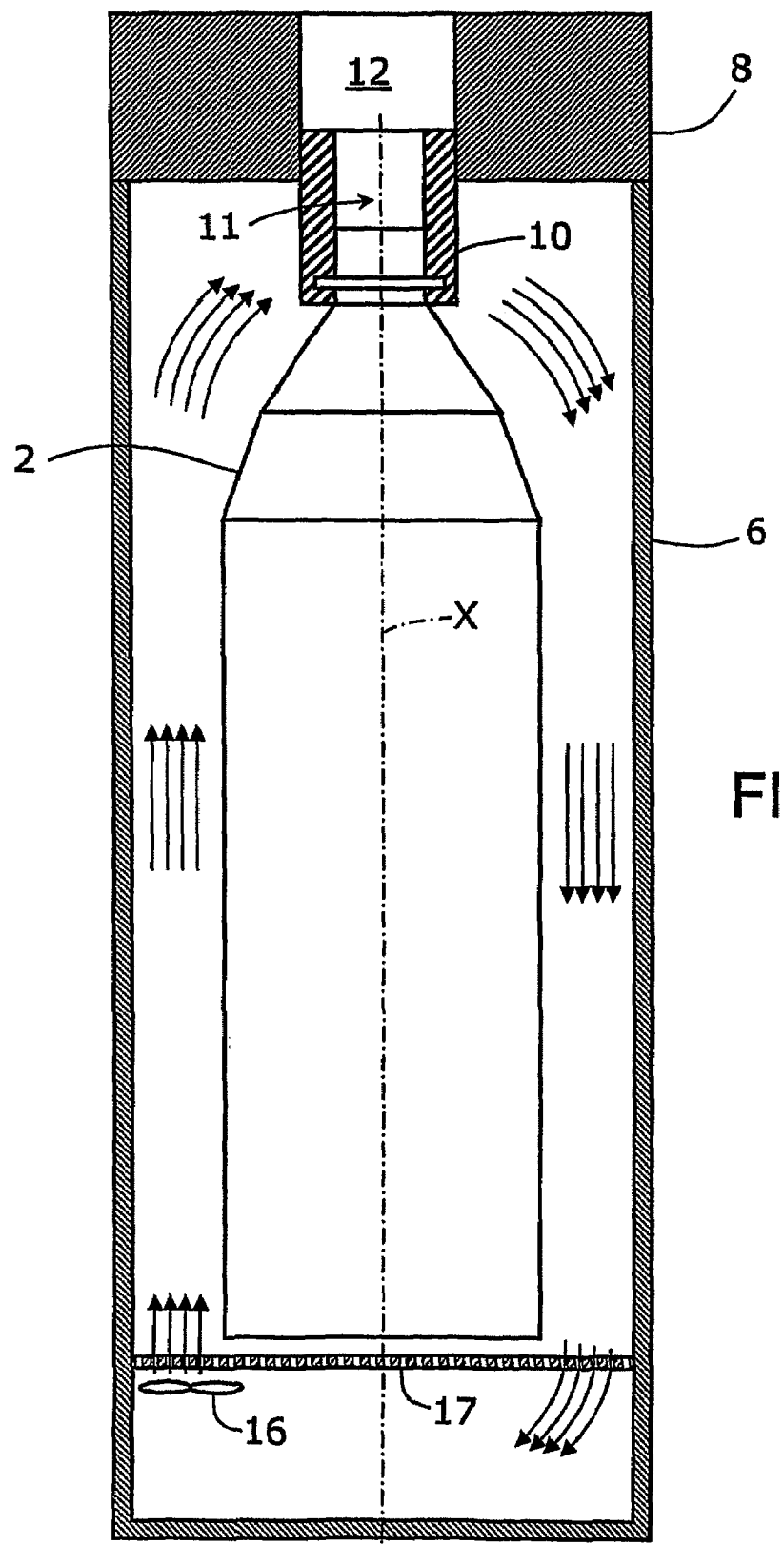
FIG. 5 is a partial cross-sectional view in elevation showing a device according to a variant.

In a variant, an air flow is generated in the chamber 6 itself. This flow may be generated (while keeping in mind that the pressure in the chamber is between 30 mbar and 100 mbar) by a fan 16 positioned under the chamber 6 and separated from this by an insulating grid 17 (for example metal) protecting it from the effects of the electromagnetic waves. As illustrated in FIG. 5, the fan 16 is preferably offset toward the periphery of the chamber 6 so as to create air circulation in a loop around the container 2. In another embodiment, not represented in the figures, the fan 16 may be located on the upper part of the chamber 6. Even at the pressures mentioned above, such a circulation of air appears sufficient to limit the thermal convection between the chamber 6 and the container 2 and to keep them both at a temperature at which good microwave transmission is ensured, and at which possible residual stresses in the container 2 are not relieved.

In a variant, it is possible to generate a forced circulation in the chamber 6 by injecting fresh air (or any other inert gas) via one end and by simultaneously pumping air at the other end so as to provide cooling while keeping the moderate vacuum in the chamber 6 stable. In practice, it can for example be envisioned to connect one part of the chamber 6 (for example its base) to an air supply line and another part (for example its upper part) to a vacuum pump, the regulation of the supply and pumping flow rates being, for example, feedback-controlled depending on the pressure in the chamber 6, which can be measured using a pressure sensor.

The various arrangements which have just been described may be combined: it is hence possible to cool the chamber 6 simultaneously from the exterior by means of openings in the cavity 5, linked or not linked with a fan, and from the interior by means of air circulation generated either by a fan or by a joint injection/pumping device.

Whichever arrangement is adopted, it has been observed that cooling the chamber 6, from the exterior and/or from the interior, eliminates the abovementioned problems of poor distribution of the barrier layer over the internal wall of the container 2. This distribution is at least more homogeneous than in the past, and better mechanical behavior of low-weight containers is observed.

The invention claimed is:

1. A device for plasma depositing a thin film of a barrier material on an internal wall of a container, said device comprising:
   an electromagnetic wave generator;
   a cavity connected to said generator and made of a conductive material;
   a chamber positioned in said cavity for introducing the container inside and made of a material that is transparent to electromagnetic waves coming from said generator; and
   a plurality of openings made in a circumferential wall of said cavity and oriented such that axes of adjacent openings are parallel to one another, and axes of the openings directly opposed to each other are collinear,
   wherein said device is mounted on a carousel rotated along a circular path passing through an axis of said cavity, and
   said openings are oriented in a direction forming an angle with a local tangent to the circular path of the carousel, being turned toward an exterior of the carousel, and in dependence on a rotation direction of the carousel.

2. The device as claimed in claim 1, wherein said angle is between 5° and 45°.

3. The device as claimed in claim 1, further comprising a fan positioned upstream of said cavity and facing said cavity.

4. The device as claimed in claim 1, wherein said openings are distributed substantially over the entire circumference of said cavity.

5. The device as claimed in claim 1, wherein said openings are distributed substantially over the entire height of said cavity.

6. The device as claimed in claim 1, wherein a density of openings over said cavity is between $1/cm^2$ and $0/cm^2$.

7. The device as claimed in claim 1, wherein the openings are positioned in direct contact with an ambient air which circulates within the cavity by surrounding the chamber with the container.

8. The device as claimed in claim 1, wherein the openings comprise through openings positioned in direct contact with an ambient air and an inside area of the cavity, and
   the openings draw the ambient air into the inside area of the cavity and expel an air from the inside area of the cavity under an influence of a rotation of the carousel.

9. The device as claimed in claim 1, wherein the container is positioned within the chamber while the thin film of the barrier material is being plasma deposited on the internal wall of the container.

* * * * *